United States Patent
Dong et al.

(10) Patent No.: US 7,570,100 B2
(45) Date of Patent: Aug. 4, 2009

(54) POTENTIAL AND RATE ADJUST HEADER SWITCH CIRCUITRY REDUCING TRANSIENT CURRENT

(75) Inventors: Wei Dong, Plano, TX (US); Hiep Tran, Dallas, TX (US); Hugh T. Mair, Fairview, TX (US); Uming Ko, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/918,869

(22) Filed: Aug. 16, 2004

(65) Prior Publication Data

US 2006/0033551 A1 Feb. 16, 2006

(51) Int. Cl.
*H03K 17/687* (2006.01)

(52) U.S. Cl. ........................ 327/427; 327/544

(58) Field of Classification Search ................. 327/205, 327/206, 170, 427, 544
See application file for complete search history.

(56) References Cited

U.S. PATENT DOCUMENTS 5,781,050 A * 7/1998 Russell ........................ 327/170
6,084,456 A * 7/2000 Seol ........................... 327/206
6,429,687 B1 * 8/2002 Ishihara et al. ............... 326/93

FOREIGN PATENT DOCUMENTS

JP 10163826 A * 6/1998

* cited by examiner

*Primary Examiner*—Quan Tra
(74) *Attorney, Agent, or Firm*—Lawrence J. Bassuk; W. James Brady; Frederick J. Telecky, Jr.

(57) ABSTRACT

System and method for providing power to circuitry while avoiding a large transient current. A preferred embodiment comprises a distributed switch (such as switch arrangement 400) with a plurality of switches (such as switch 405) coupling a power supply to the circuitry. Each switch is individually controlled by a control signal and is turned on sequentially. Also coupled to each switch is a pre-driver circuit (such as pre-driver circuit 410). The pre-driver circuit comprises a potential adjust circuit (such as potential adjust circuit 505) that rapidly adjusts a voltage potential at the switch and a rate adjust circuit (such as the rate adjust circuit 520) that accelerates the power ramp-up across the switch once transient currents are no longer a concern. Adjusting the voltage potential so that the switch operates in a saturation mode increases an effective capacitance across the switch and thereby retarding the power ramp-up across the switch.

6 Claims, 5 Drawing Sheets

POTENTIAL AND RATE ADJUST HEADER SWITCH CIRCUITRY REDUCING TRANSIENT CURRENT

TECHNICAL FIELD

The present invention relates generally to a system and method for integrated circuits, and more particularly to a system and method for turning on an internal voltage rail in an integrated circuit while avoiding a large transient current.

BACKGROUND

Providing power to circuitry in an integrated circuit (via turning on an internal voltage rail) can be a difficult proposition, especially during power-on (turn on) and power-off (turn off). For example, during power-on, when power is initially provided to the circuitry, the power-on current can increase rapidly and result in a large transient current. Large transient currents can be damaging to the transistors in the circuitry. This problem can be further exacerbated when high-gain transistors, such as input/output (I/O) PMOS transistors, are used as the switch for the power supply. In such a situation, the fast turn on could result in large transient currents while these high-gain transistors charge up the internal rail.

One commonly used technique to help reduce the magnitude of the transient current is to use multiple switches arranged sequentially with respect to one another and coupled in between the power supply and the circuitry. Each of the switches in the sequence of switches can be smaller than the single switch that they replace. Then, the switches can be turned on in single fashion, with a small delay between consecutive switches. Since each switch is smaller than the switch that is replaced, the amount of current is smaller. Furthermore, with a delay being present between consecutive switches being turned on, the transient current is spread out over time. This can effectively reduce the severity of the transient current.

One disadvantage of the prior art is that even with smaller transistors being used in the sequence of switches, as each switch is being turned on, a transient current of significant magnitude can still occur. Therefore, with the use of multiple switches, a sequence of transient currents can be produced, each having a magnitude that can cause problems.

Another disadvantage of the prior art is that since the large transient current will typically occur rapidly after the switch is closed, it can be desirable to accelerate the power ramp-up after the danger of the transient current has passed and the use of the sequence of switches does not allow for the acceleration of the power ramp-up.

SUMMARY OF THE INVENTION

These and other problems are generally solved or circumvented, and technical advantages are generally achieved, by preferred embodiments of the present invention which provide a system and method for providing power to circuitry in an integrated circuit while avoiding a large transient current.

In accordance with a preferred embodiment of the present invention, a circuit for adjusting a power ramp-up across a first transistor comprising a potential adjust circuit and a rate adjust circuit is provided. The potential adjust circuit is coupled to the first transistor and to a first power supply and to a second power supply, while the rate adjust circuit is coupled between a first source/drain terminal of the first transistor and the second power supply. The potential adjust circuit is configured to change a voltage potential at a gate terminal of the first transistor in a controlled manner when the first transistor is turned on and the rate adjust circuit is configured to accelerate the power ramp-up across the first transistor when a voltage potential at the first source/drain terminal of the first transistor reaches a threshold.

In accordance with another preferred embodiment of the present invention, a distributed switch comprising a plurality of switches and a plurality of pre-driver circuits is provided. Each switch in the plurality of switches is coupled between a first power supply and a circuit, and each pre-driver circuit in the plurality of pre-driver circuits is coupled to a switch in the plurality of switches. Each switch in the plurality of switches selectively couples the first power supply to the circuit and can be independently controlled. A pre-driver circuit is configured to adjust a voltage potential at the switch to which it is coupled and to adjust a power ramp-up rate.

In accordance with yet another preferred embodiment of the present invention, a method for reducing transient current magnitude, the method comprising turning on a switch, wherein the switch is one of a plurality of switches and retarding a current ramp-up across the switch once a voltage potential at the switch reaches a first threshold is provided. Once the voltage potential at the switch reaches a second threshold, the current ramp-up across the switch is accelerated. All the while, a pre-determined amount of time is allowed to pass before repeating the turning, retarding, accelerating, and waiting for remaining switches in the plurality of switches.

An advantage of a preferred embodiment of the present invention is that the Miller capacitance effect is used to effectively increase the rise time of a current flowing across a transistor being used as a switch. By increasing the rise time of the current, the magnitude and abruptness of the current can be reduced.

A further advantage of a preferred embodiment of the present invention is that while the Miller capacitance effect allows the increased current rise time and results in the power applied to the circuitry ramping up slowly, the power ramp up can speed up as the power approaches full power.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a header switch for providing power to logic circuitry in an integrated circuit. The invention may also be applied, however, to other power supply applications, wherein there is an interest in reducing power-on transient currents and there is sensitivity to large transient currents.

Figure 1:
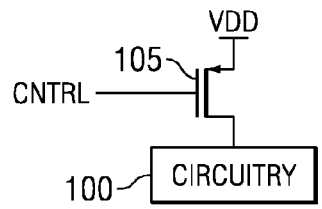
FIG. 1 is a diagram of an arrangement for providing power to circuitry in an integrated circuit through the use of an integrated transistor.

With reference now to FIG. 1, there is shown a diagram illustrating an arrangement for providing power to circuitry 100 in an integrated circuit through the use of a transistor 105. The transistor 105 is coupled to a voltage supply "VDD" and the circuitry 100. A control signal "CNTRL" coupled to a gate terminal of the transistor 105 can control the state of the transistor 105. For example, depending upon the value of a signal on the control signal "CNTRL," the transistor 105 can either be open (non-conducting) or closed (conducting). When the transistor 105 is open, the circuitry 100 is not coupled to the voltage supply "VDD" and power is not provided to the circuitry 100. When the transistor 105 is closed, the circuit 100 is coupled to the voltage supply "VDD" and power is provided to the circuitry 100.

The arrangement shown in FIG. 1 is commonly referred to as a header configuration and the transistor 105 is commonly referred to as a header switch. Preferably, a p-type metal oxide semiconductor (PMOS) transistor is used for a header switch. In order to provide sufficient current when closed and to minimize leakage current when open, a transistor with sufficient geometry is normally used. In fabrication processes with limited transistor types and/or sizes, an input/output (I/O) transistor with a high threshold voltage is commonly used.

When the control signal "CNTRL" causes the transistor 105 to close, the rapid change of state can create a large transient current to flow through the transistor 105 and to the circuitry 100. A cause for the large transient current is the transistor's high gain, wherein a relatively small current can be amplified into a large current. If the transient current is of sufficient magnitude, problems can result in the circuitry 100, including possible damage to delicate transistors in the circuitry 100.

Figure 2:
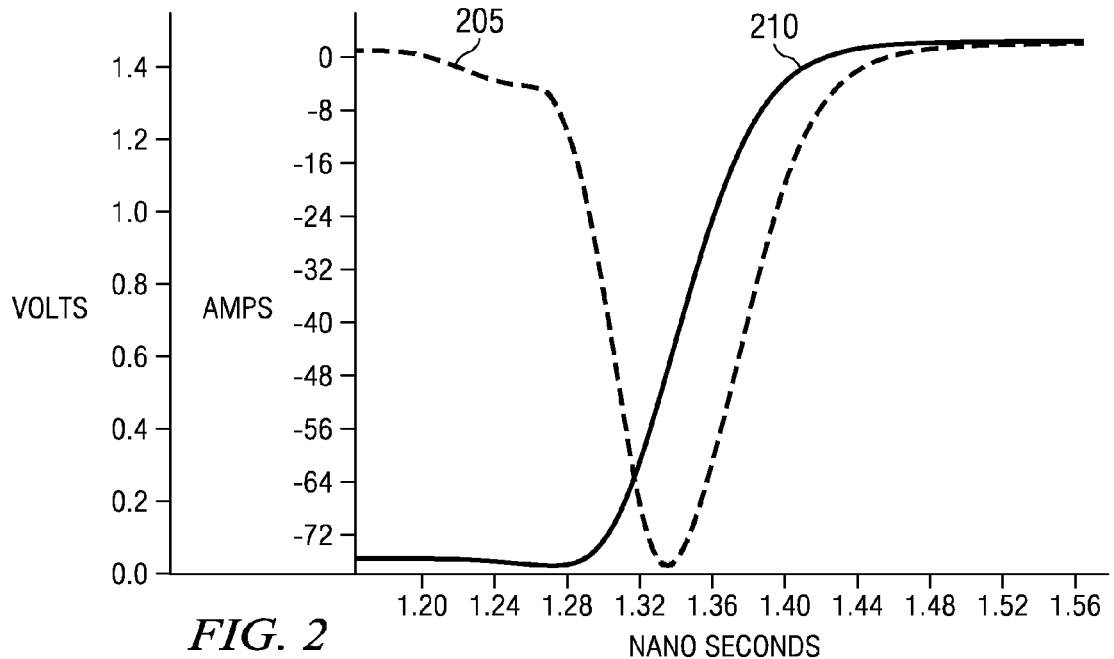
FIG. 2 is a data plot of a power-on transient current and power ramp-up for an arrangement such as shown in FIG. 1.

With reference now to FIG. 2, there is shown a data plot illustrating a power-on transient current and the ramping up of the power when a switch is turned on. The results shown in FIG. 2 are from simulation studies of an exemplary switch coupling a power supply to circuitry in an integrated circuit. A first curve 205 displays the transient current and a second curve 210 displays the power ramp up. The first curve 205 shows that the transient current can have a magnitude of more than 72 amperes and last for a duration as short as 0.20 nanoseconds. Consequently, the power ramp up (the second curve 210) also rapidly increases.

Figure 3:
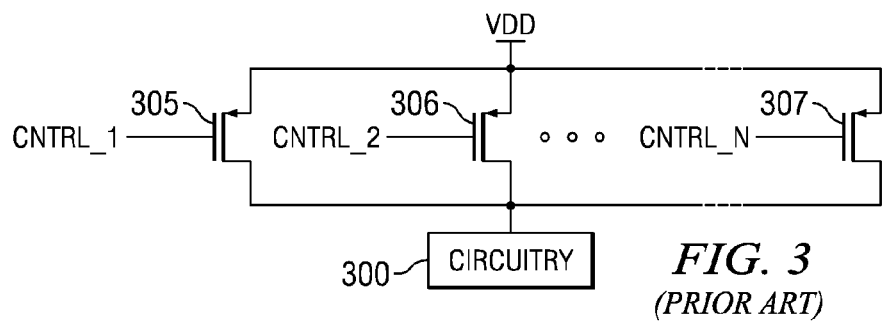
FIG. 3 is a diagram of a prior art switch arrangement for providing power to circuitry with reduced power-on transient current.

With reference now to FIG. 3, there is shown a diagram illustrating a prior art switch arrangement for providing power to circuitry in an integrated circuit with reduced power-on transient current. As discussed previously, the use of a single switch to couple circuitry to a voltage supply can result in a large power-on transient current that can be damaging to the circuit. FIG. 3 displays one possible rearrangement of the switch to help reduce the power-on transient current. Instead of a single switch, circuitry 300 in an integrated circuit can be coupled to a voltage supply "VDD" via a plurality of switches, such as switches 305, 306, and 307. Each of the switches can be controlled by a separate control signal. For example, switch 305 can be controlled by a control signal "CNTRL_1," switch 306 can be controlled by a control signal "CNTRL_2," and switch 307 can be controlled by a control signal "CNTRL_N." Note that each one of the switches, such as switch 305, should be smaller than the single switch (as shown in FIG. 1).

When power is to be provided to the circuitry 300, each one of the switches can be turned into a closed state to couple the circuitry 300 to the voltage supply "VDD." Note that each of the switches is turned into the closed state individually and that there is a delay between the closing of one switch and the closing of another switch. For example, the switch 305 may be the first switch to be closed and then after a delay, the switch 306 can be closed, and so forth. The sequential closing of the plurality of switches instead of the closing of the single switch can effectively reduce the magnitude of the power-on transient current as well as spread the power ramp-up over a period of time. The switches are shown to be coupled to a common power rail and the circuitry 300. However, it may be possible that each of the switches may be coupled to a different power rail and to a different portion of the overall circuitry 300.

Although the use of multiple switches in place of a single switch can reduce the power-on transient current by spreading it out over a period of time, it may still be possible to have transient currents of significant magnitude when each one of the switches are closed. Furthermore, as each of the switches are being closed and the power being provided to the circuitry 300 approaches the desired value, the delay in the power ramp-up remains substantially constant and therefore can cause a delay in the power ramp-up. This can result in a delay in the amount of time that it takes to reach the desired power for the circuitry 300, delaying the commencement of operations for the circuitry 300.

Figure 4:
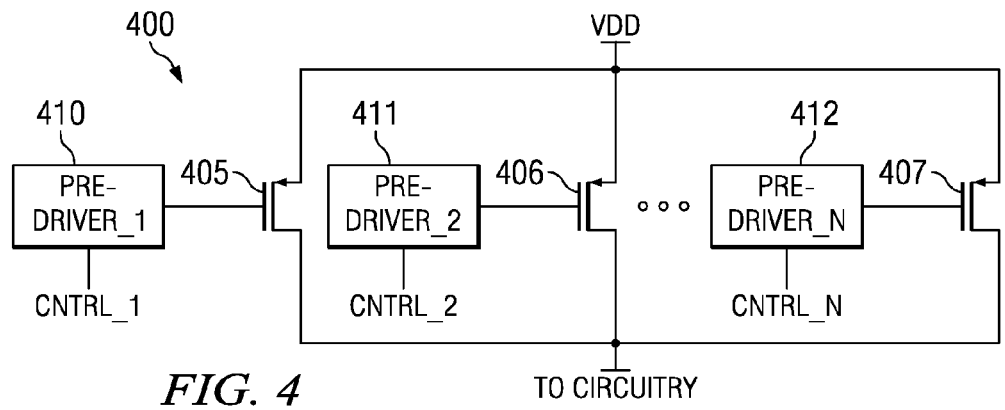
FIG. 4 is a diagram of a switch arrangement for providing power to an integrated circuit with reduced power-on transient current and power ramp-up, according to a preferred embodiment of the present invention.

With reference now to FIG. 4, there is shown a diagram illustrating a schematic of a switch arrangement 400 for providing power to circuitry in an integrated circuit with reduced power-on transient current and power ramp-up, according to a preferred embodiment of the present invention. The switch arrangement 400 makes use of multiple switches, such as switches 405, 406, and 407, arranged in parallel to each other and coupled to both the voltage supply "VDD" and the circuitry in the integrated circuit. As in the prior art switch arrangement shown in FIG. 3, each switch can be controlled by a separate control signal. For example, switch 405 can be controlled by a control signal "CNTRL_1" while switches 406 and 407 can be controlled by control signals "CNTRL_2" and "CNTRL_N." Note that due to fabrication process constraints, it may be necessary to create each switch (such as switches 405, 406, and 407) out of a plurality of switches. For example, if the fabrication process does not permit the fabrication of a single switch of adequate size, multiple switches arranged in a parallel fashion can be used to create a sufficiently large switch.

However, rather than having a control signal directly control the state of the switch to which it is coupled, such as control signal "CNTRL_1" and switch 405, the control signal can be provided to a pre-driver circuit, such as "PRE-DRIVER_1" 410 for switch 405 and "PRE-DRIVER_2" 411 and "PRE-DRIVER_N" 412 for switches 406 and 407. The pre-driver circuit can then be coupled to the switch. The pre-driver circuit can control the turn-on of the switch. According to a preferred embodiment of the present invention, the pre-driver circuit can make use of Miller capacitance feedback to control the rate of turn-on of the switch.

The Miller capacitance feedback can effectively delay the turn-on of the switch in this case, since the source terminals of the switches (such as switches 405, 406, and 407) are coupled together and the drain terminals of the switches are coupled together. When configured in such a fashion, each switch can see a full load capacitance on the internal rail, which can translate to a large Miller capacitance when the gate voltage of each of the switch is near the threshold voltage, which can help reduce the magnitude of the power-up transient current. Furthermore, since the Miller capacitance feedback can vary depending on a voltage difference seen at the switch, the power ramp-up can be accelerated as the power provided to the circuitry nears the desired level. For example, when the power provided to the circuitry is near the desired level, the voltage difference can be small. Therefore, the delay imparted by the Miller capacitance feedback on the turn-on of the switch can be relatively small, thereby decreasing the amount of time that it takes to reach the desired power level. A detailed description of the pre-driver circuit is provided below.

Figure 5A:
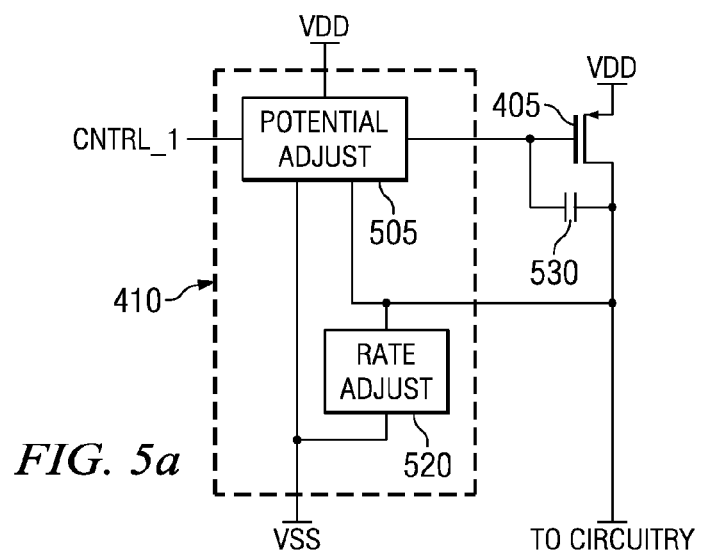
FIGS. 5a and 5b are diagrams of a portion of the switch arrangement with emphasized detail placed upon a pre-driver circuit, according to a preferred embodiment of the present invention.

With reference now to FIG. 5a, there is shown a diagram illustrating a portion of the switch arrangement 400 with emphasized detail upon a pre-driver circuit 410, according to a preferred embodiment of the present invention. The pre-driver circuit 410 can include two distinct circuits that can be used to control the power ramp-up across the switch 405. A first circuit, referred to as a potential adjust circuit 505, can be used to control the voltage potential seen at the gate terminal of the switch 405. The potential adjust circuit 505 can be coupled to the control signal used to control the state of the switch 405 (such as "CNTRL_1") and the base terminal of the switch 405. The potential adjust circuit 505 can be coupled to the primary voltage source "VDD" and a secondary voltage source. By controlling the voltage potential seen at the gate terminal of the switch 405, it can take advantage of an effect known as the Miller capacitance to adjust the power ramp-up across the switch 405. The Miller capacitance can change the effective capacitance of a natural capacitance seen across the gate and source terminals of the switch 405. The natural capacitance exists due to the construction of the PMOS transistor used as the switch 405 (note that this capacitance is seen in other types of transistors and is not limited to PMOS transistors). In FIG. 5a, this capacitance is shown as capacitor 530. By controlling the voltage potential seen at the gate terminal of the switch 405 when the switch 405 is turned on, it can be possible to control the capacitance of the capacitor 530. By increasing the capacitance of the capacitor 530, it is possible to retard the power ramp-up of the switch 405. The retarding of the power ramp-up can help decrease the magnitude of the transient current.

A second circuit, referred to as a rate adjust circuit 520, can be used to adjust the power ramp-up of the switch 405 after the initial turning on of the switch 405. The rate adjust circuit 520 can be coupled to the drain terminal of the switch 405, the potential adjust circuit 505, and a secondary voltage source. Note that the secondary voltage source to which the rate adjust circuit 520 is coupled to may be the same as the secondary voltage source to which the potential adjust circuit 505 is coupled or it may be different. Since the transient current is primarily seen in the early stages of the turning on of the switch 405, it can be possible to accelerate the power ramp-up of the switch 405 once a majority of the transient current has passed. By doing so, it can be possible to speed up the power ramp-up without incurring the risk of a large transient current.

Figure 5B:
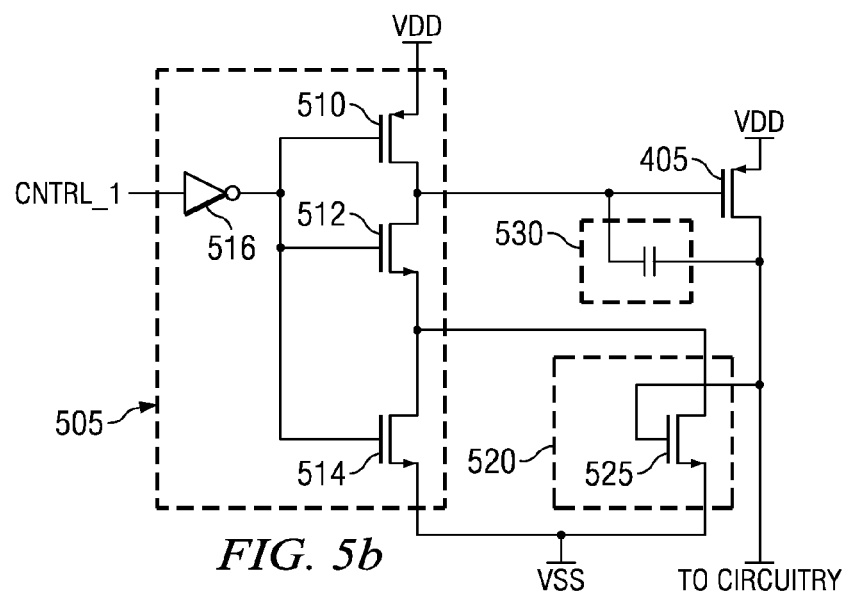

With reference now to FIG. 5b, there is shown a diagram illustrating a portion of the switch arrangement 400 with emphasized detail upon the potential adjust circuit 505 and the rate adjust circuit 520, according to a preferred embodiment of the present invention. According to a preferred embodiment of the present invention, the potential adjust circuit 505 can be created using transistors arranged in serial fashion, coupled between the primary voltage source "VDD" and the secondary voltage source. A first transistor 510, preferably a PMOS transistor, can have its source terminal coupled to the primary voltage source "VDD" and its drain terminal coupled to a second transistor 512, preferably an NMOS transistor, via the second transistor's drain terminal. A source terminal of the second transistor 512 can be coupled to a third transistor 514, preferably an NMOS transistor, via the third transistor's drain terminal. A source terminal of the third transistor 514 may then be coupled to the secondary voltage source.

Each transistor's gate terminals may be coupled together and to the control signal responsible for controlling the state of the switch 405. An output of the potential adjust circuit 505 may be taken at the drain terminal of the first transistor 510 and can be coupled to the gate terminal of the switch 405. Note that the three transistors 510, 512, and 514 are basically arranged in an inverting buffer configuration and depending upon the design of the control signal, an optional inverting buffer 516 can be used to maintain the desired polarity of the control signal. Note that the remaining pre-driver circuits 411 and 412 (and others not shown) may have a similar design, with differences possibly being in the sizing (geometry) of transistors to facilitate different turn-on rates.

The third transistor 514 may be used to decrease the effective size of the pull-down portion of the three-transistor chain (i.e., effectively creating a single small transistor from two larger transistors, the second and third transistors 512 and

514). Note that if it may be possible to fabricate a single transistor of desired size, a singe transistor can be used in place of the second and third transistors 512 and 514. Additionally, if there is a need for a yet smaller pull-down transistor, more than two pull-down transistors can be used. The use of a smaller transistor in the pull-down portion can more slowly place a voltage potential substantially equal to the secondary voltage source at the gate terminal of the switch 405. The rate of change in the voltage potential seen at the gate of the switch 405 can be regulated so that it rises slowly, and when it finally rises to above the threshold voltage, an increase in capacitance of the capacitor 530 (via the Miller effect) can help further by reducing the power ramp-up of the switch 405.

According to a preferred embodiment of the present invention, the rate adjust circuit 520 can be implemented with a single transistor 525, preferably an NMOS transistor. The transistor 525 may have its gate terminal coupled to the drain terminal of the switch 405 and its source terminal coupled to the secondary voltage source, while its drain terminal can be coupled to the drain of the transistor 514. As discussed previously, the secondary voltage source in the rate adjust circuit 520 may be the same as the secondary voltage source used in the potential adjust circuit 505. Configured as such, the transistor 525 will begin to conduct as the voltage at its gate terminal (which is at the same voltage potential as the drain terminal of the switch 405) reaches a certain threshold voltage. Once the transistor 525 begins to conduct, it provides an additional current path, increasing the rate of pull-down seen at the gate terminal of the switch 405.

The combination of the potential adjust circuit 505 and the rate adjust circuit 525 can operate as follows: after the switch 405 is turned on by the control signal "CNTRL_1," current begins to flow. Note that at substantially the same instant that the switch 405 is turned on, pull-down transistors (the second and third transistors 512 and 514) can begin to change the voltage potential at the gate terminal of the switch 405 to the secondary voltage supply. When the voltage potential reaches the threshold of switch 405, the Miller capacitance seen as the capacitor 530 effectively increases and retards the power ramp-up rate across the switch 405 to a greater extent. As the current across the switch 405 increases, the potential at the gate terminal of the transistor 525 increases until it reaches a second threshold. Once the potential at the gate terminal of the transistor 525 reaches the second threshold, the transistor 525 turns on and current begins to flow across the transistor 525. According to a preferred embodiment of the present invention, the second threshold can be a voltage potential that is some small delta from the value of the power supply. Once the potential at the gate terminal of the transistor 525 exceeds the second threshold, the voltage potential provided to a power rail in to the circuitry has become close enough to the voltage potential of the power supply so that the danger of the transient current has passed. Therefore, it can be safe to accelerate the power ramp-up across the switch 405. The additional current path across the transistor 525 can help to accelerate the power ramp-up across the switch 405. The acceleration of the power ramp-up is effected by the switch 405 operating in a linear mode, wherein the gain of the switch 405 is smaller than when switch 405 is operating in a saturation mode.

Figure 6A:
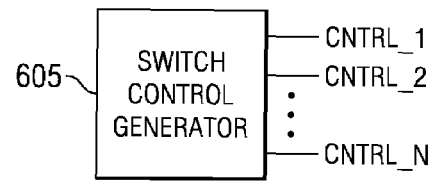
FIGS. 6a and 6b are diagrams of a switch control generator circuit, according to a preferred embodiment of the present invention.

With reference now to FIG. 6a, there is shown a diagram illustrating a switch control generator 605, which can be used to generate the individual control signals for controlling the turn-on and turn-off of the switches 405 in the switch arrangement 400, according to a preferred embodiment of the present invention. As discussed previously, the individual switches 405 present in the switch arrangement 400 should be turned on individually and with a delay being present between the time when one switch is turned on and when the next switch is turned on. Turning on each switch individually and with a delay present can help to reduce the magnitude of a transient current. To accomplish this, the switch control generator 605 can have N outputs, where N is the total number of switches in the switch arrangement 400. According to a preferred embodiment of the present invention, to turn on a certain switch, the switch control generator 605 can assert a logic true value on that switch's control signal. For example, to turn on switch number 1, the switch control generator 605 can assert a logic true value on the control signal "CNTRL_1." Furthermore, once the switch control generator 605 turns on a switch, the switch control generator 605 will keep the switch turned on until all switches are to be turned off.

Figure 6B:
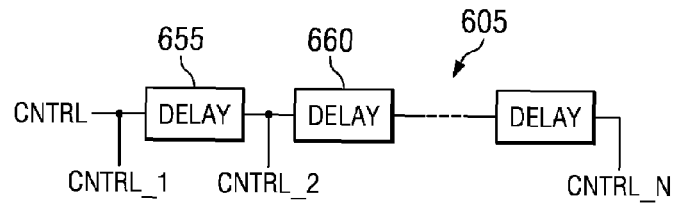

With reference now to FIG. 6b, there is shown a diagram illustrating a detailed view of a switch control generator 605, according to a preferred embodiment of the present invention. The switch control generator 605 may be implemented as a sequence of delay elements (for example, delay elements 655 and 660). According to a preferred embodiment of the present invention, the sequence of delay elements can be arranged in a linear fashion, with the output of one delay element, such as delay element 655, being the input of the next delay element, such as delay element 660. A single control signal "CNTRL" can be used to generate the N distinct control signals produced by the switch control generator.

One possible configuration of the switch control generator 605 can be as follows. The control signal for switch number 1, "CNTRL_1," can be the control signal "CNTRL" itself. Therefore, when a logic true value is asserted on the control signal "CNTRL," then the control signal "CNTRL_1" also immediately assumes the logic true value. Then, after a delay equal to the delay element 655, the control signal for switch number 2, "CNTRL_2," will assume the logic true value. This continues until the control signal for switch number N, "CNTRL_N," assumes the logic true value. Note that the individual delays due to the delay elements can be substantially equal to each other. Alternatively, the delay of each delay element can be individually adjusted to provide the desired transient current suppression. For example, the delay of the first few initial delay elements can be longer than the delay of the later delay elements. This can be due to the fact that the transient current is typically more pronounced for the first few switches.

Figure 7:
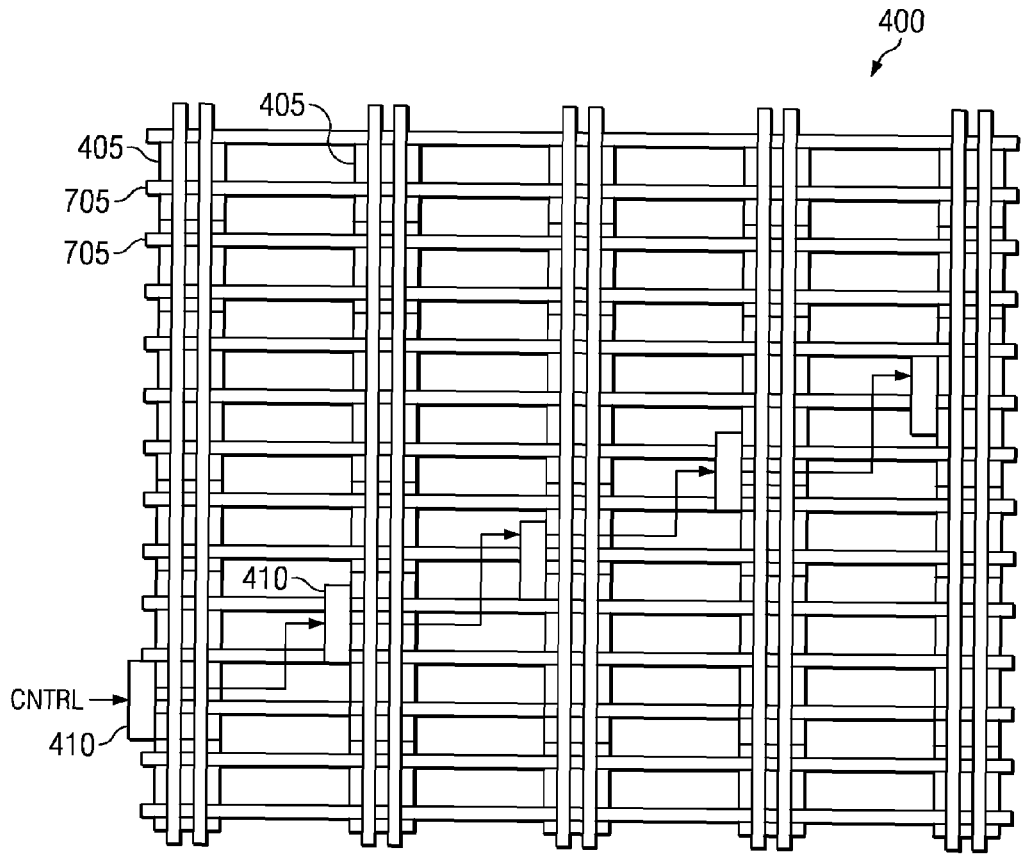
FIG. 7 is a diagram of a layout of the switch arrangement, according to a preferred embodiment of the present invention.

With reference now to FIG. 7, there is shown a diagram illustrating a layout of switch arrangement 400, according to a preferred embodiment of the present invention. As discussed previously, the switch arrangement 400 can be made up of a plurality of switches 405. Each switch 405 can be implemented as a plurality of transistors and is shown in FIG. 7 as an arrangement of transistors aligned vertically. The arrangement of transistors as shown can effectively produce a single transistor (switch 405) that is larger than what may be produced by the manufacturing process. Coupled to each switch 405 is the pre-driver 410. Note that the pre-driver 410 is a simplified view and does not provide the actual layout of the transistors present in the pre-driver 410 as discussed in reference to FIG. 5a.

Running horizontally across the switch arrangement are lines 705 of the power grid. Since the switch 405 is made up of a plurality of transistors, when the switch 405 is turned on, the transistors closer to the pre-driver 405 will turn on prior to the transistors further away from the pre-driver 405. Similarly, the lines 705 of the power grid that are closer to the pre-driver 410 will be able to conduct sooner. Therefore, to help more evenly distribute the turn on of the transistors in the switches 405 and the lines 705 of the power grid, the pre-drivers 410 can be arranged in such a way that the order that transistors in the switches 405 are turned on and lines 705 in the power grid are energized is varied. Note that it may be possible to line the pre-drivers 410 up in a horizontal line with no resulting change in the spirit of the present invention.

Figure 8:
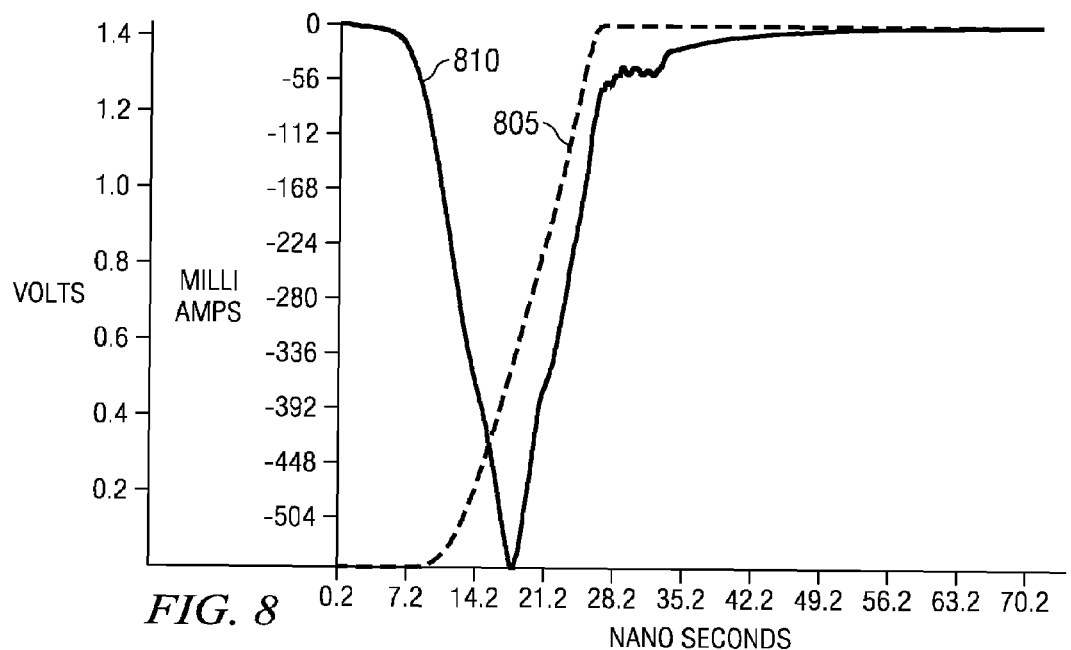
FIG. 8 is a data plot of a power-on transient current and power ramp-up when a switch is turned on, wherein the switch structure is used and a strong corner model is used for simulation, according to a preferred embodiment of the present invention.

With reference now to FIG. 8, there is shown a data plot illustrating a power-on transient current and the ramping up of the power when a switch is turned on, wherein a switch structure such as the switch structure 400 is used and a strong corner process model is used for simulation, according to a preferred embodiment of the present invention. To compare the effectiveness of the switch structure 400 in reducing transient current against that of an ordinary switch structure, simulation studies of an implementation of the switch structure 400 coupling a power supply to an integrated circuit were performed using a strong corner process model. A strong corner process model is considered well understood by those of ordinary skill in the art of the present invention.

When a switch structure such as the switch structure 400 is used with properly sized transistors, the transient current achieves its maximum magnitude of approximately 550 milli-amps at a time of approximately 20 nano-seconds. When compared with the results shown in FIG. 2, wherein the transient current has a maximum magnitude of approximately 75 amps at 1.35 nano-seconds (curve 810), clearly, the use of the switch structure 400 greatly reduced the magnitude of the transient current (by more than two orders of magnitude) and the transient current peak was delayed by about 19 nano-seconds. Similarly, the power ramp-up was retarded (curve 805).

Figure 9:
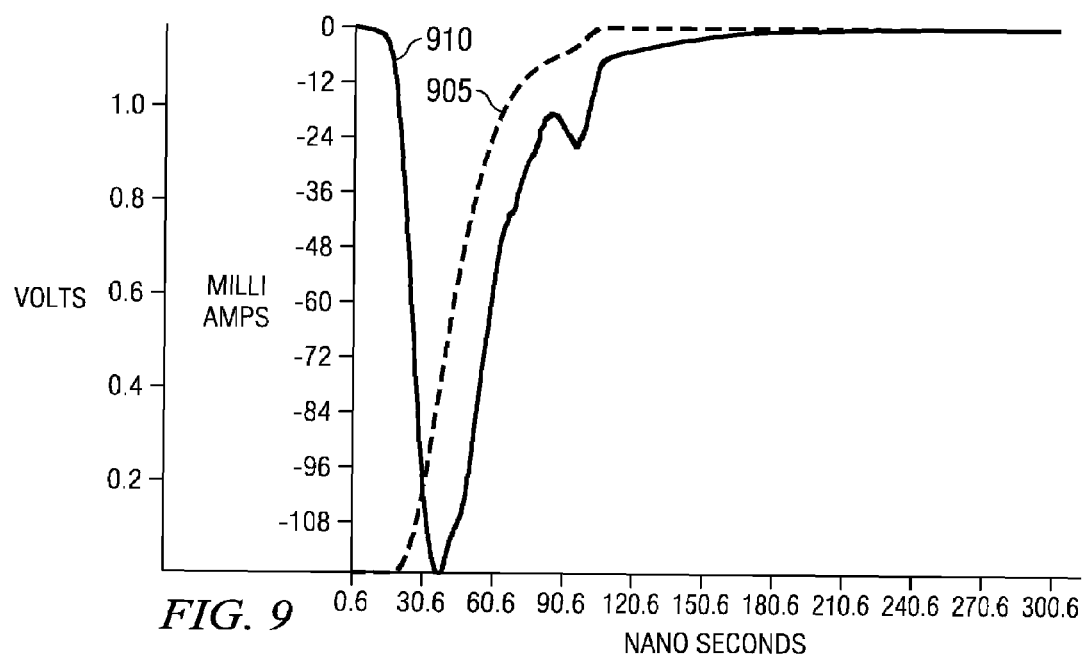
FIG. 9 is a data plot of a power-on transient current and power ramp-up when a switch of the same size as that used in obtaining the results shown in FIG. 2 is turned on, wherein the switch structure is used and a weak corner model is used for simulation, according to a preferred embodiment of the present invention.

With reference now to FIG. 9, there is shown a data plot illustrating a power-on transient current and the ramping up of the power when a switch is turned on, wherein a switch structure such as the switch structure 400 is used and a weak corner process model is used for simulation, according to a preferred embodiment of the present invention. The results shown in FIG. 9 are from another set of simulation studies wherein a different process model was used. Using a weak corner process model, the transient current achieves its maximum magnitude of approximately 115 milli-amps at a time of approximately 40 nano-seconds. When compared with the results shown in FIG. 2, the use of the switch structure 400 reduced the magnitude of the transient current by almost three orders of magnitude (750 times smaller) and the peak was delayed by about 39 nano-seconds (curve 910). Furthermore, the power ramp-up was delayed by a significant amount of time (curve 905).

Figure 10:
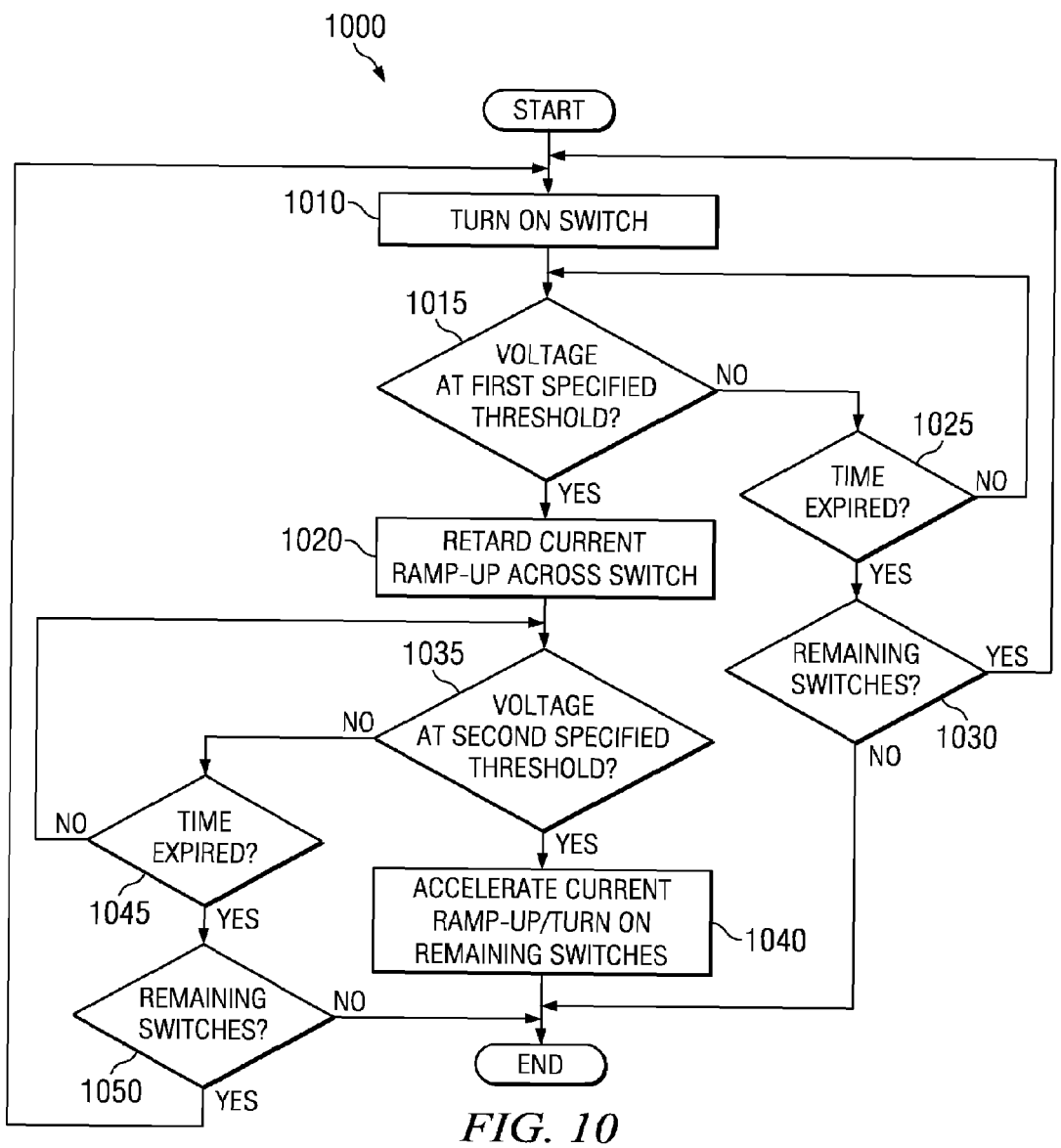
FIG. 10 is a sequence of events involved in reducing power-on transient current and power ramp-up when power is applied to a circuit, according to a preferred embodiment of the present invention.

With reference now to FIG. 10, there is shown a diagram illustrating a sequence of events 1000 involved in reducing a transient current and retarding power ramp-up when power is applied to a circuit, according to a preferred embodiment of the present invention. The sequence of events 1000 illustrates the use of a distributed switch structure, such as the switch structure 400, in reducing the magnitude of a transient current and retarding the power ramp-up that would typically occur if a power supply were instantaneously coupled to a circuit. A reduction in the magnitude of the transient current and the power ramp-up rate can help to reduce the probability of damage to the circuit. However, once the danger from the transient current passes, the power ramp-up rate can be increased to help shorten the power turn-on time.

The sequence of events 1000 may begin when a first switch in the distributed switch is turned on (block 1010). According to a preferred embodiment of the present invention, the distributed switch can be made up of a plurality of switches arranged in parallel and each switch can be controlled by a control signal. After the first switch is turned on, the voltage potential at the drain of the switch 405 increases and power ramp-up of the switch 405 begins. The power ramp-up of the switch continues until the voltage potential at the drain of the switch reaches a first specified threshold (block 1015). If the voltage potential has reached the pre-determined threshold, the current ramp up is retarded by the Miller capacitance since the switch now is in the saturation region (block 1020).

If the voltage potential has not reached the first threshold, then the voltage potential will be permitted to rise. However, a timer can be checked to see if a delay corresponding to a period of time between when a first switch is turned on and a second switch is turned on has expired. If the delay (a time period) has not expired (block 1025), then the voltage potential will be permitted to continue to rise. If the time period has expired, then a check to determine if there are any remaining switches to be turned on (block 1030) can be performed. Note that the time period between the turning on of the switches can be implemented as delay elements (such as delay elements 655 and 660 (FIG. 6b)) and when implemented as such, the check for the expiration of the time period can be done implicitly without requiring an actual test for the expiration of the time period due to the design of the switch control generator 605. If there are remaining switches, then the next switch can be turned on (block 1010) and the sequence of events 1000 is repeated. If there are no more switches to be turned on, then the sequence of events 1000 can terminate.

As the current ramp-up is being accelerated, the potential of the voltage being provided by the distributed switch can be compared with a second specified threshold (block 1035). The purpose of the second specified threshold can be to determine if the voltage being provided by the distributed switch is close enough to the desired voltage potential and if it is, then the transient current has substantially passed and the current ramp-up can be accelerated (block 1040). The current ramp-up can be accelerated by creating an additional current path via the use of a rate adjust circuit, such as by the rate adjust circuit 520 (FIG. 5a). Furthermore, the current ramp-up can be additionally accelerated by turning on any remaining switches since there is no longer a fear of damaging transient current (block 1040). If the voltage has not reached the second specified threshold, then the time that corresponds to the delay between the turning on of consecutive switches can be checked (block 1045). If the time has expired, then a check to determine if there are any remaining switches to be turned on (block 1050) can be performed. If there are remaining switches, then the next switch can be turned on (block 1010) and the sequence of events 1000 is repeated. If the time has not expired (block 1045), then the voltage potential will be permitted to continue to rise.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention.

Accordingly, the appended claims are intended to include within their scope such processes, machines, manufacture, compositions of matter, means, methods, or steps.

What is claimed is:

1. An integrated circuit comprising:
   A. a first power output lead at a first voltage, the first power lead carrying power to operate the integrated circuit;
   B. a second power output lead at a second voltage different from the first voltage;
   C. operating circuitry having a power input lead receiving power to operate the circuitry; and
   D. header switch circuitry including:
      i. a PMOS transistor switch having source/drain leads connected to the first power output lead and the power input lead and having a gate lead, when conductive the PMOS transistor conducting power from the first power output lead to the power input lead;
      ii. potential adjust circuitry having a first lead connected to the first power output lead, a control input, an output lead connected to the gate lead of the PMOS transistor switch, and a second lead connected to the second power output lead, the adjust circuitry including a series connection of a PMOS transistor, a first NMOS transistor, and a second NMOS transistor between the first and second power output leads, the control input being connected to the gates of the series connected transistors, and the output lead being connected to the connection between the PMOS transistor and the first NMOS transistor; and
      iii. rate adjust circuitry including a third NMOS transistor having source/drain leads connected between the connection of the second and third NMOS transistors and the second power output lead, and having a gate lead connected to the power input lead.

2. The integrated circuit of claim 1 in which the PMOS transistor switch exhibits a Miller capacitance that retards the power ramp-up rate across the switch as the voltage at the base lead approaches the second voltage.

3. The integrated circuit of claim 1 in which the third NMOS transistor has a threshold turn on voltage that is a small amount less than the first voltage.

4. The integrated circuit of claim 1 including multiple header switch circuitry connected between the first power output lead and the power input lead.

5. The integrated circuit of claim 1 including multiple header switch circuitry connected between the first power output lead and the power input lead, each header switch circuitry having a separate control input, and control circuitry having a control input and one control output connected to each control input, the control circuitry including delay elements connected between the control input and the control outputs.

6. The integrated circuit of claim 1 including multiple header switch circuitry connected between the first power output lead and the power input lead, the multiple header switch circuitry being spaced apart on the integrated circuit.

* * * * *